(12) United States Patent
Faller

(10) Patent No.: US 7,339,157 B2
(45) Date of Patent: Mar. 4, 2008

(54) ILLUMINATION DEVICE

(75) Inventor: Alexander Faller, Dachau (DE)

(73) Assignee: Patent-Treuhand-Gesellschaft für elektrische Glühlampen mbH, München (DE)

( * ) Notice: Subject to any disclaimer, the term of this patent is extended or adjusted under 35 U.S.C. 154(b) by 0 days.

(21) Appl. No.: 11/652,362

(22) Filed: Jan. 11, 2007

(65) Prior Publication Data

US 2007/0159831 A1    Jul. 12, 2007

(30) Foreign Application Priority Data

Jan. 11, 2006 (DE) .......................... 10 2006 001 490

(51) Int. Cl.
*F21V 3/00* (2006.01)

(52) U.S. Cl. .................. 250/227.11; 362/555; 359/639

(58) Field of Classification Search ........... 250/227.11; 362/555; 359/639, 640
See application file for complete search history.

(56) References Cited

U.S. PATENT DOCUMENTS 4,151,582 A * 4/1979 Grunberger .................. 362/622
7,090,386 B2 * 8/2006 Coushaine et al. ......... 362/555

* cited by examiner

*Primary Examiner*—John R. Lee
(74) *Attorney, Agent, or Firm*—Cohen Pontani Lieberman & Pavane LLP

(57) ABSTRACT

An illumination device, comprising a light emitting diode (11) fixed on a circuit board (12). The illumination device furthermore has an optical element (10) disposed downstream of the light emitting diode (11) in a main emission direction (15), the optical element (10) being configured for directing a first portion (6a) of the electromagnetic radiation (9) emitted by the light emitting diode (11) during operation through the circuit board (12) in a direction away from the circuit board (12).

13 Claims, 7 Drawing Sheets

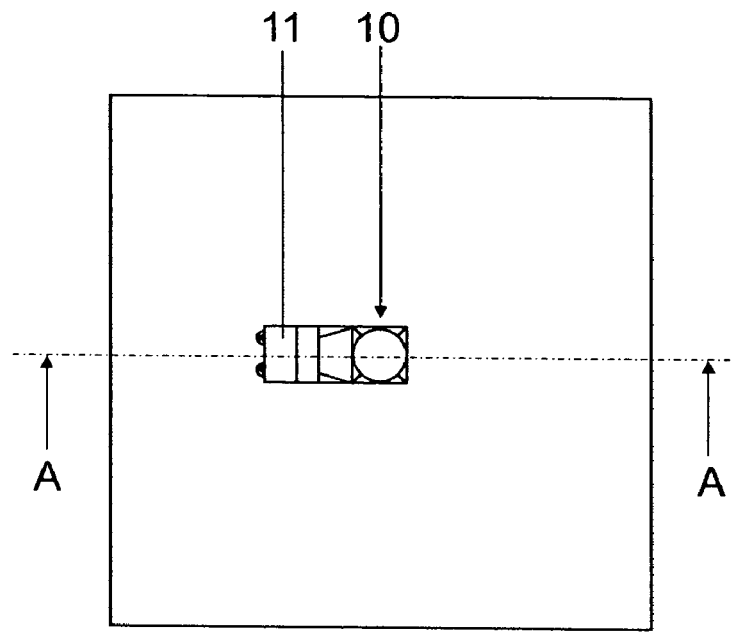
FIG 2B
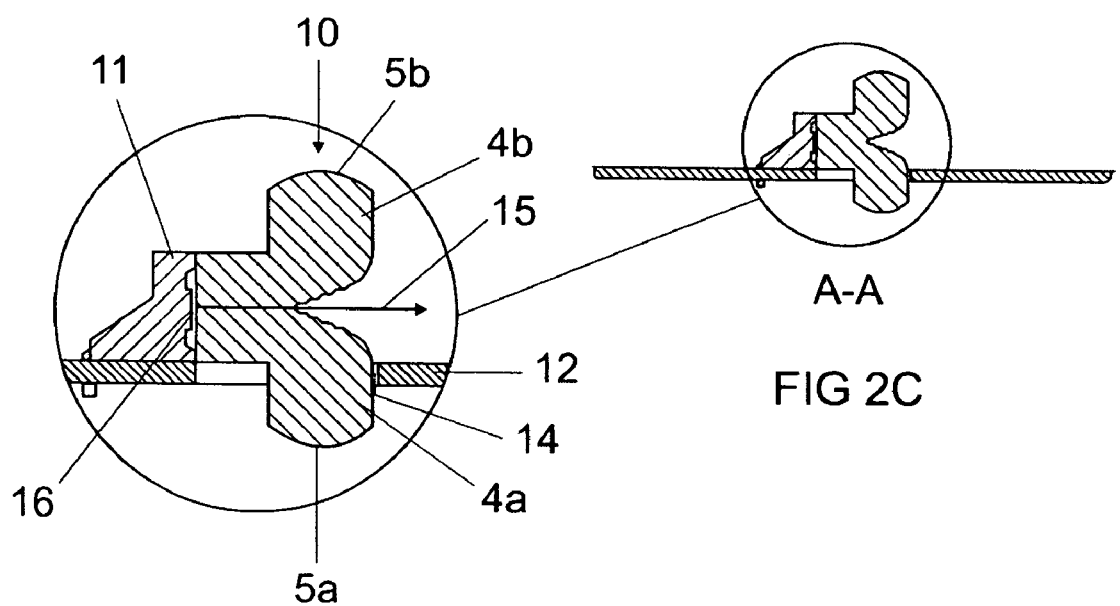
FIG 2D
A-A
FIG 2C

ILLUMINATION DEVICE

RELATED APPLICATIONS

The patent application claims the priority of German Patent Application 10 2006 001 490.1 filed Jan. 11, 2006, the disclosure content of which is hereby incorporated by reference.

FIELD OF THE INVENTION

The preset invention is an illumination device and, more particularly, a light-emitting device with an optical element disposed downstream with both being fixed to a circuit board.

SUMMARY OF THE INVENTION

One object of the invention is to provide an illumination device which can be produced particularly simply and cost-effectively.

In accordance with at least one embodiment, the illumination device has a circuit board. The circuit board has a basic body, for example, which may comprise an electrically insulating material. Conductor tracks comprising an electrically conductive material are applied on at least portions of the surface of the basic body of the circuit board. Via the conductor tracks, electrical contact can be made with an optoelectronic component fixed on the circuit board.

In accordance with at least one embodiment of the illumination device, at least one light emitting diode is fixed on the circuit board. The light emitting diode comprises at least one light emitting diode chip. The light emitting diode furthermore comprises a housing, in which the chip is fixed and electrical contact is made with said chip. The light emitting diode has a main emission direction preferably running perpendicular to a radiation exit surface of the light emitting diode chip and coinciding for example with an optical axis of the light emitting diode chip. The light emitting diode is preferably applied to the circuit board in such a way that the main emission direction of the light emitting diode runs parallel at least to a portion of the circuit board.

In accordance with at least one embodiment of the illumination device, an optical element is disposed downstream of the light emitting diode in the main emission direction. The optical element is preferably suitable for guiding a first portion of the electromagnetic radiation emitted by the light emitting diode during operation through the circuit board in a direction away from the circuit board. That is to say that the optical element guides a portion of the radiation of the light emitting diode in the direction of the side of the circuit board opposite to the side on which the light emitting diode is fixed. From there the electromagnetic radiation is emitted in directions that are directed away from the circuit board. That is to say that said radiation does not impinge on the circuit board.

In accordance with at least one embodiment of the illumination device, the illumination device has a light emitting diode fixed on a circuit board. The illumination device furthermore has an optical element disposed downstream of the light emitting diode in a main emission direction, the optical element being suitable for guiding a first portion of the electromagnetic radiation emitted by the light emitting diode during operation through the circuit board in a direction away from the circuit board.

In accordance with at least one embodiment of the illumination device, the optical element is furthermore suitable for guiding a second portion of the electromagnetic radiation emitted by the light emitting diode during operation, on the side of the circuit board on which the light emitting diode is fixed, away from the circuit board. That is to say that the optical element guides the second portion of the radiation essentially in the opposite direction to the first portion of the radiation. In this case, "essentially in the opposite direction" is to be understood to mean that rays of the first and second portions of the electromagnetic radiation do not overlap. The rays of the first and second portions of the electromagnetic radiation are directed in opposite directions away from the circuit board.

In this case, the illumination device described makes use of the idea, inter alia, that an illumination device that emits on both sides in this way is particularly well suited to the backlighting of image and information carriers, such as are used for example in light advertising or in information columns. In this case, the illumination device may replace for example planar optical waveguides in which light is coupled in laterally. The illumination device thereby enables a luminous system having a small housing thickness having high luminance uniformity, high luminance, good thermal properties and a long lifetime of the luminous means. The illumination device is particularly economical since, on account of the emission on two sides, it illuminates and/or backlights two mutually opposite surfaces running parallel to one another, for example, with a reduced number of luminous means. Furthermore, the illumination device described may also be used in the illumination of interior spaces or exterior regions.

In accordance with at least one embodiment of the illumination device, the optical element has two radiation exit regions. The radiation exit regions are in each case closed off by radiation exit surfaces through which a large part of the electromagnetic radiation coupled into the optical element leaves the latter again. Preferably, the radiation exit regions of the optical element are optically decoupled from one another. That is to say that if electromagnetic radiation is radiated into the optical element through a radiation exit surface of one radiation exit region, it does not pass to the radiation exit surface of the other radiation exit region, and vice-versa.

In accordance with at least one embodiment of the illumination device, the optical element has a radiation splitting region. The radiation splitting region is formed for example by a portion of the surface of the optical element. Preferably, the radiation splitting region is configured in reflective fashion and formed in such a way that, through reflection of the radiation impinging on it, it splits said radiation into two portions that are directed in mutually different directions. In this case, the reflection at the radiation splitting region may be effected by total reflection and/or on account of a reflective, for example metallic, coating of the optical element.

In accordance with at least one embodiment of the illumination device, the radiation splitting region is suitable for splitting the electromagnetic radiation coupled into the optical element into two partial beams having essentially identical intensity and for directing each partial beam in the direction of a radiation exit region. "Two partial beams having essentially identical intensity" means that the partial beams may have a slightly different intensity on account of, for example, production-dictated nonuniformities of the radiation splitting region. Preferably, however, the partial beams have identical intensities.

Preferably, essentially the entire electromagnetic radiation coupled into the optical element is split into two partial beams having identical intensity by the radiation splitting region. The partial beams then leave the optical element through the radiation exit surfaces of the optical element, so that essentially the entire electromagnetic radiation coupled in emerges from the optical element again through the two radiation exit surfaces. "Essentially the entire electromagnetic radiation coupled in" means that it is possible on account of absorption or reflection losses, for example, for a portion of the electromagnetic radiation coupled into the optical element not to leave the latter or not to leave the latter through one of the radiation exit surfaces. Preferably, however, at least 90% of the radiation coupled in emerges through one of the two radiation exit surfaces.

In accordance with at least one embodiment of the illumination device, the optical element has two radiation exit surfaces. The optical element preferably has exactly two radiation exit surfaces. The two radiation exit surfaces preferably adjoin air. That is to say that, preferably, no further optical elements—for example optical waveguides—are directly connected to the radiation exit surfaces of the optical element.

In accordance with at least one embodiment of the illumination device, the optical element of the illumination device has a radiation entrance surface. Preferably, the optical element has exactly one radiation entrance surface through which electromagnetic radiation passes into the radiation entrance region of the optical element. In this case, the radiation entrance surface may adjoin air. That is to say that an air gap is formed between a radiation exit surface of the light emitting diode and the radiation entrance surface of the associated optical element. Particularly divergent electromagnetic radiation of the light emitting diode can then be reflected before entering into the optical element at the radiation entrance surface and, in this way, does not pass into the optical element.

It is also possible as an alternative, however, for the optical element to be optically coupled to the light emitting diode for example by means of an index matching gel that connects the radiation exit surface of the light emitting diode to the radiation entrance surface of the optical element.

In accordance with at least one embodiment of the illumination device, the circuit board on which the light emitting diode is fixed has a perforation through which the optical element directs a portion of the electromagnetic radiation emitted by the light emitting diode and thus guides it through the circuit board in a direction away from the circuit board. Said perforation may be for example a stamped-out portion or hole in the circuit board. Preferably, one of the radiation exit regions of the optical element is led through the perforation, so that the associated radiation exit surface is situated on that side of the circuit board which is remote from the light emitting diode. In accordance with at least one embodiment, the optical element is mechanically fixed on the circuit board. Preferably, the optical element is in this case not fixed at the light emitting diode, but rather only on the circuit board.

In accordance with at least one embodiment of the illumination device, the optical element has an undercut by means of which the optical element is clipped into the perforation of the circuit board. It is furthermore possible for the optical element to be fixed for example by means of a press-fit in the perforation of the circuit board. The optical element is preferably fixed at the circuit board in a manner free of connecting means. That is to say that the optical element is for example not adhesively bonded onto the circuit board, but rather fixed purely mechanically on the circuit board. Preferably, the optical element is in this case not mechanically connected to the light emitting diode.

The illumination device described here makes use in this case of the idea, inter alia, that such an illumination device can be produced particularly simply. It thus becomes possible for the circuit board to be populated with the optical elements after the light emitting diodes have been soldered on, manually or by means of an automatic placement machine by simply pressing the optical element into the circuit board. It is also possible, in particular, for a plurality of optical elements in an assemblage—for example transfer-molded or injection-molded elements which are still connected to one another by webs—to be simultaneously and jointly pressed into the circuit board.

In accordance with at least one embodiment, the circuit board is one of the following circuit boards: flexible circuit board, printed circuit board (PCB), metal-core circuit board. Preferably, a plurality of light emitting diodes and associated optical elements are applied on a circuit board. The light emitting diodes and optical elements may be arranged for example in series as a linear model or at the corner points of a regular two-dimensional grid—as an array—on the circuit board.

BRIEF DESCRIPTION OF THE DRAWINGS

FIG. 2B shows a schematic plan view of the illumination device in accordance with the first exemplary embodiment.

FIG. 2C shows a schematic sectional illustration taken along line A-A in FIG. 2B.

FIG. 2D shows an enlargement of a portion of FIG. 2C.

DETAILED DESCRIPTION OF THE DRAWINGS

In the exemplary embodiments and figures, identical or identically acting constituent parts are in each case provided with the same reference symbols. The constituent parts illustrated and also the size relationships among the constituent parts are not to be regarded as true to scale. Rather, some details of the figures are illustrated with an exaggerated size to afford a better understanding.

Figure 1A:
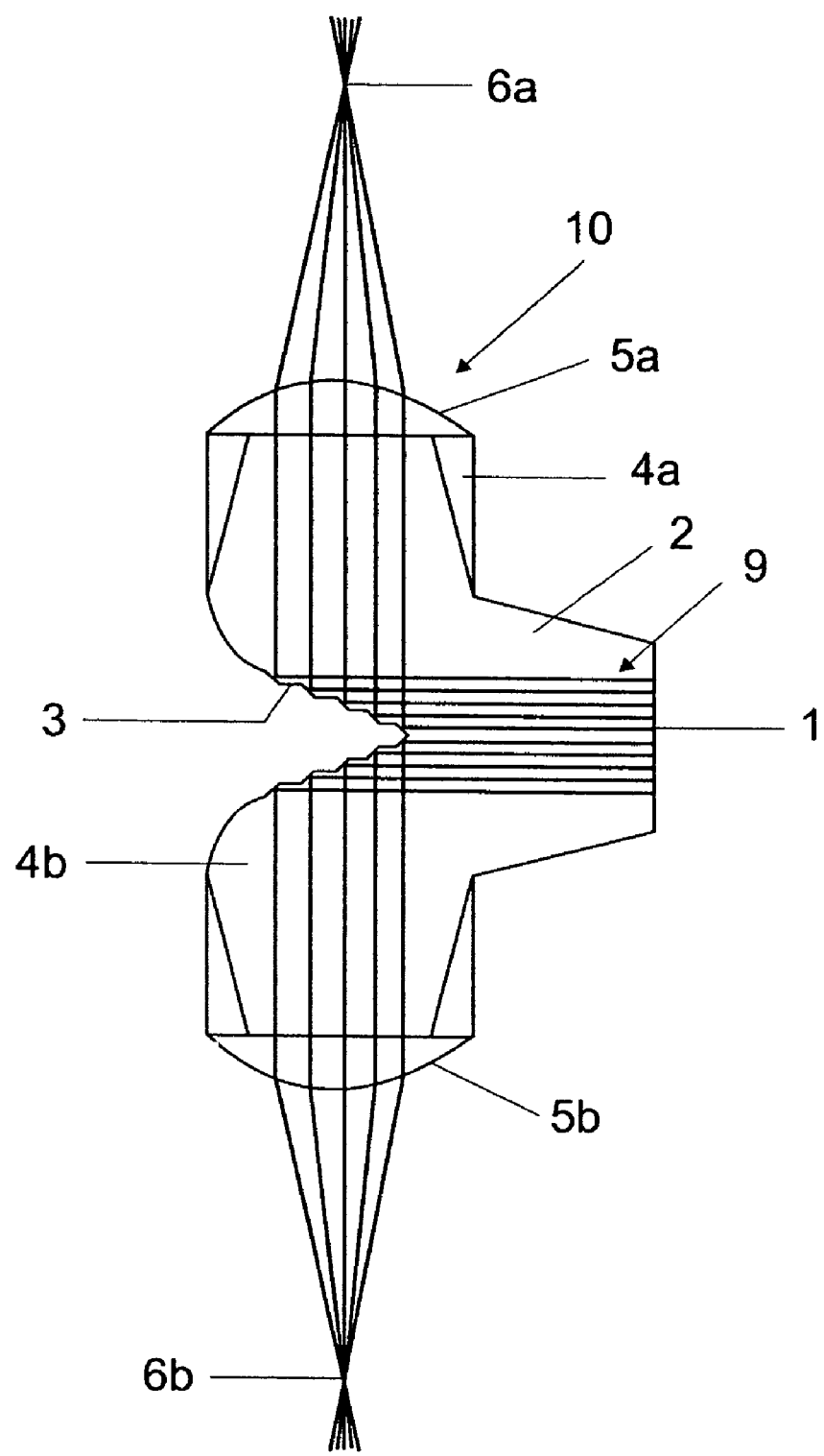
FIG. 1A shows a schematic side view of an optical element in accordance with a first exemplary embodiment.

FIG. 1A shows a schematic side view of a first exemplary embodiment of an optical element such as may be used in an illumination device described here.

The optical element 10 has a radiation entrance surface 1. Electromagnetic radiation 9 is coupled into the optical element 10 through the radiation entrance surface 1. The electromagnetic radiation 9 passes through the radiation entrance region 2, from where it impinges on the radiation splitting region 3. The radiation splitting region 3 is formed by a portion of the surface of the optical element 10. By way of example, the radiation splitting region 3 is formed by a cutout in the optical element 10, said cutout being formed in V-like or V-shaped fashion in section. In addition, the radiation splitting region 3 may have microstructurings provided for beam shaping and/or for increasing the reflectivity of the beam shaping region 3.

The optical element 10 is preferably a solid body formed from a dielectric material—for example a transparent plastic or glass. In this case, the optical element 10 may comprise the following materials or contain at least one of these materials: PMMA (Polymethylmethacrylat), polycarbonate, PMMI (Polymethacrylmethylimid), COC (Cyclo-Olefin-Copolymer), glass. In this case, the optical element is preferably injection-molded or transfer-molded.

The electromagnetic radiation 9 is split into two partial beams 6a, 6b at the radiation splitting region 3. The splitting is preferably effected as uniformly as possible, so that the partial beams 6a, 6b have essentially the same intensity. The radiation splitting is effected by reflection at the radiation splitting region 3. The radiation is preferably subjected to total reflection in this case. However, it is also possible for the optical element to be coated reflectively at least in the region of the radiation splitting region 3. For this purpose, the optical element may for example have a metal vapor-deposited on it.

In the exemplary embodiment of FIG. 1A, the radiation entrance region 2 is formed as a non-imaging optical concentrator that tapers in the direction toward the radiation entrance surface 1. The radiation entrance region is shaped in the manner of a truncated cone or a truncated pyramid.

From the radiation splitting region 3, the partial beams 6a, 6b are directed into the adjacent radiation exit regions 4a, 4b. The partial beams 6a, 6b emerge from the optical element through the radiation exit surfaces 5a, 5b. For this purpose, the radiation exit surfaces 5a, 5b may for example be curved convexly toward the outside in lenslike fashion. It is thereby possible to achieve, for example, a collimation of the partial beams 6a, 6b.

Figure 1B:
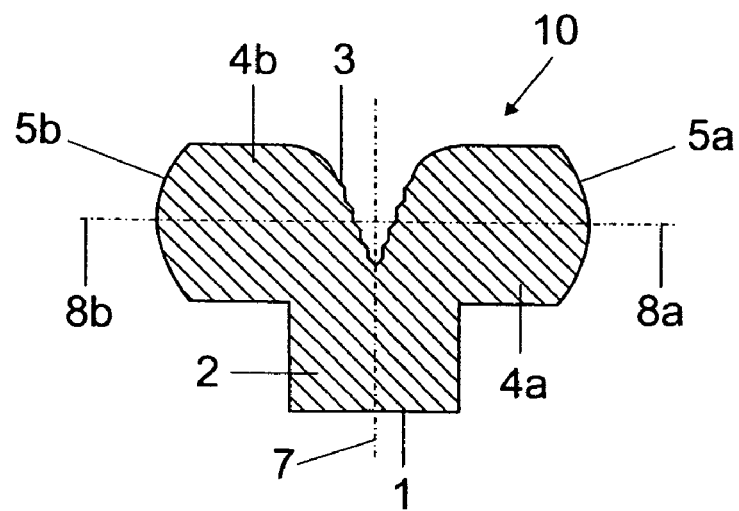
FIG. 1B shows a schematic sectional illustration of an optical element in accordance with a second exemplary embodiment.

FIG. 1B shows an optical element in a schematic sectional illustration in accordance with a second exemplary embodiment. The optical element 10 is formed axially symmetrically with respect to a central axis 7 running through the geometrical center of the radiation entrance surface 1. The optical axes 8a, 8b of the radiation exit regions 4a, 4b form an angle of 180°. In this way, the optical element 10 is suitable for splitting electromagnetic radiation 9 coupled into the optical element 10 into two partial beams 6a, 6b having essentially identical intensity which radiate in opposite directions.

In the case of the optical elements 10 described in conjunction with FIGS. 1A and 1B, the radiation exit regions 4a, 4b are optically decoupled from one another. That is to say that a large part of radiation which penetrates into the optical element 10 through the radiation exit surface 5a, for example, cannot pass to the radiation exit surface 5b without leaving the optical element 10 in the process.

Figure 2A:
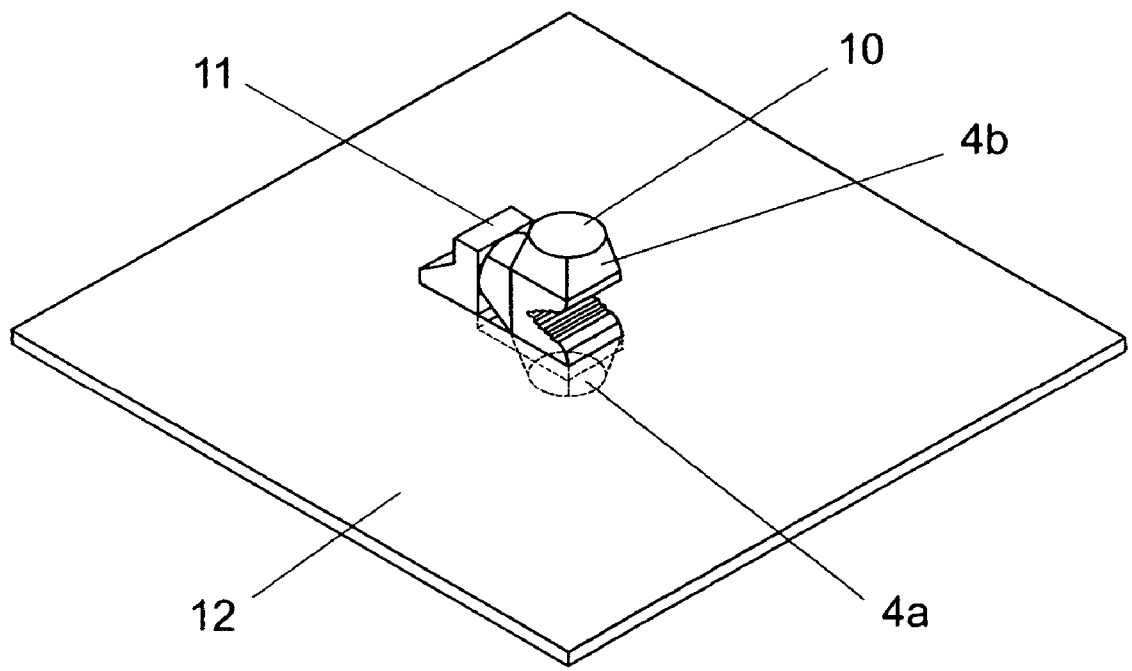
FIG. 2A shows the illumination device described here in a schematic perspective illustration in accordance with a first exemplary embodiment.

FIG. 2A shows the illumination device described here in accordance with a first exemplary embodiment in a schematic perspective illustration. FIG. 2B shows a schematic plan view of said illumination device in accordance with the first exemplary embodiment. FIGS. 2C and 2D show a schematic sectional illustration of the illumination device in accordance with the first exemplary embodiment.

The illumination device comprises a circuit board 12. The circuit board 12 is, for example, a flexible circuit board, a metal-core circuit board, or a printed circuit board. Conductor tracks (not illustrated) are applied on the circuit board 12, an electrically conductive contact can be made with a light emitting diode 11 via said conductor tracks. The light emitting diode 11 is mechanically fixed on the circuit board 12. By way of example, the light emitting diode 11 may be soldered onto the circuit board 12. The light emitting diode 11 is arranged on the circuit board in such a way that its main emission direction 15 runs parallel to at least one portion of the circuit board 12. The main emission direction 15 is preferably perpendicular to the radiation exit surface of a light emitting diode chip (not shown) of the light emitting diode 11. The main emission direction 15 preferably runs parallel to the central axis 7 of the optical element 10. With its radiation entrance surface 1, the optical element 10 adjoins the light emitting diode 11. By way of example, an air gap 16 is situated between the radiation exit surface of the light emitting diode 11 and the radiation entrance surface 1 of the optical element 10.

Figure 2E:
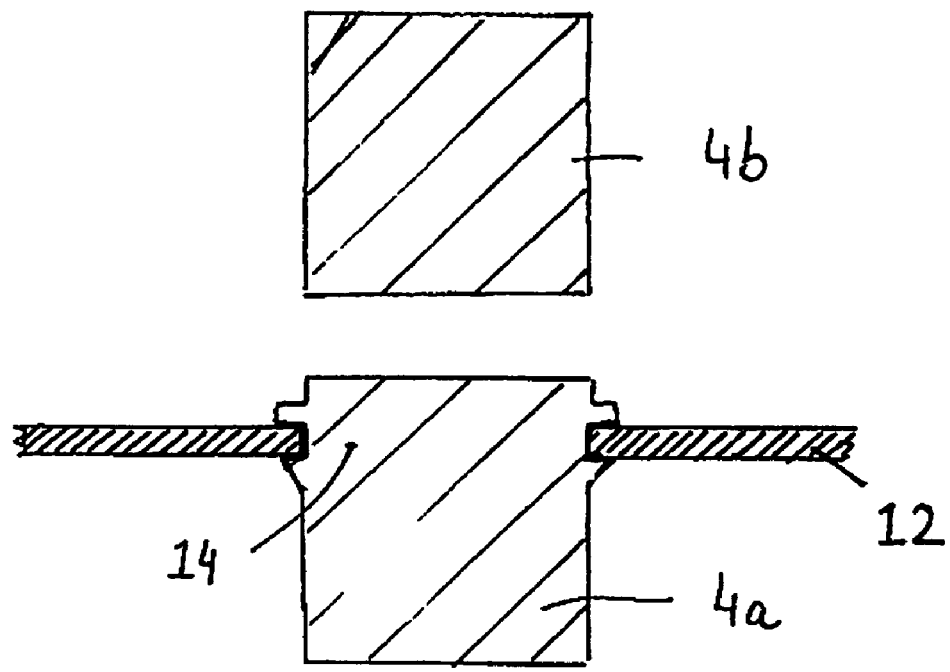
FIG. 2E shows details of the undercut of the embodiment shown in FIG. 2A.

The radiation exit region 4a of the optical element 10 may have an undercut—as shown in FIG. 2E through the optical axes 8a, 8b of the radiation exit regions and perpendicular to the optical axis 7 of the radiation entrance region of an optical element 10 with one embodiment of an undercut on either side of the circuit board 12. By means of said undercut, the optical element 10 is clipped into a perforation 14 of the circuit board 12, and is thus mechanically fixedly connected to the circuit board 12. The optical element is preferably connected to the circuit board 12 in a manner free of connecting means.

The radiation splitting region 3 of the optical element is formed as a trench that is V-shaped in section. The radiation splitting region 3 has jagged roughnesses which, by way of example, increase the probability of a total reflection of the electromagnetic radiation 9 impinging on the radiation splitting region 3.

In accordance with the exemplary embodiment shown in FIGS. 2C and 2D, the optical element 10 is fixed with the radiation exit region 4a by means of a press-fit in the perforation of the circuit board 12. The radiation exit region 4a does not have an undercut in this exemplary embodiment.

With respect to the optical elements shown in FIGS. 1A and 1B, the two embodiments are rather similar. A difference is the shape of the radiation entrance region. The radiation entrance region of the optical element in FIG. 1A is formed as a truncated cone, for example. The optical element depicted in FIG. 1B is a sectional view of an optical element like the one used for the illumination devices of the exemplary embodiments. The radiation entrance region may, for example, have a circular radiation entrance face at one end and a rectangular, in particular quadratic, cross section at the other end. This form is shown, for example, in the perspective view of FIG. 2A and in the plan view of FIG. 2B.

Figure 3A:
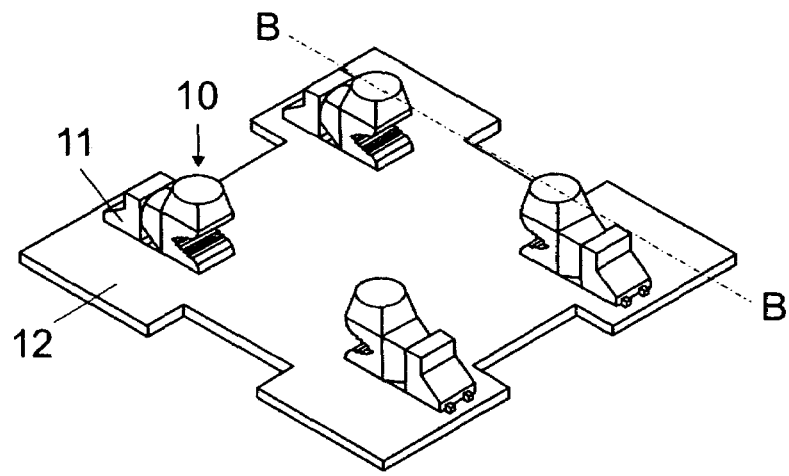
FIG. 3A shows a schematic perspective illustration of the illumination device in accordance with a second exemplary embodiment.
Figure 3B:
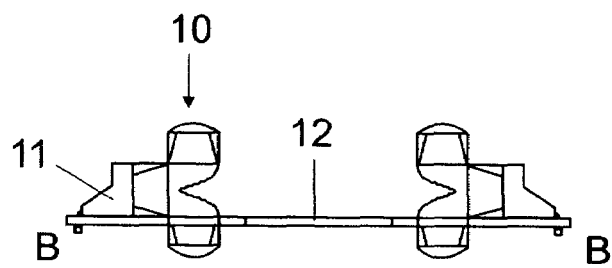
FIG. 3B shows a schematic side view of the illumination device in accordance with the second exemplary embodiment.
Figure 3C:
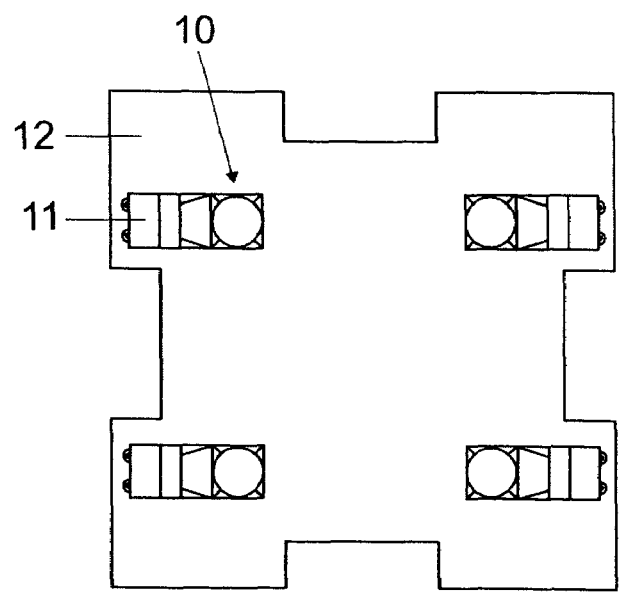
FIG. 3C shows a schematic plan view of the illumination device in accordance with the second exemplary embodiment.
Figure 3D:
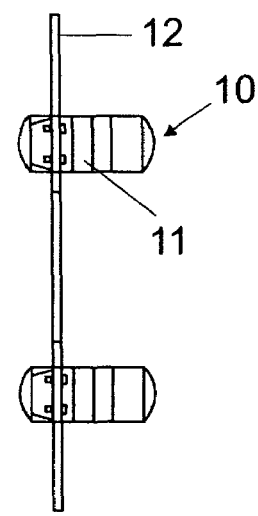
FIG. 3D shows a schematic side view of the illumination device in accordance with the second exemplary embodiment.

FIG. 3A shows a schematic perspective illustration of the illumination device in accordance with a second exemplary embodiment. FIG. 3B shows a schematic side view on the side parallel to the line BB. FIG. 3C shows a schematic plan view of the illumination device. FIG. 3D shows a schematic side view of the illumination device on the side perpendicular to the line BB.

In the exemplary embodiment of the illumination device described in conjunction with FIGS. 3A to 3D, four light emitting diodes 11 with associated optical elements 10 are arranged on a common circuit board 12.

Figure 4A:
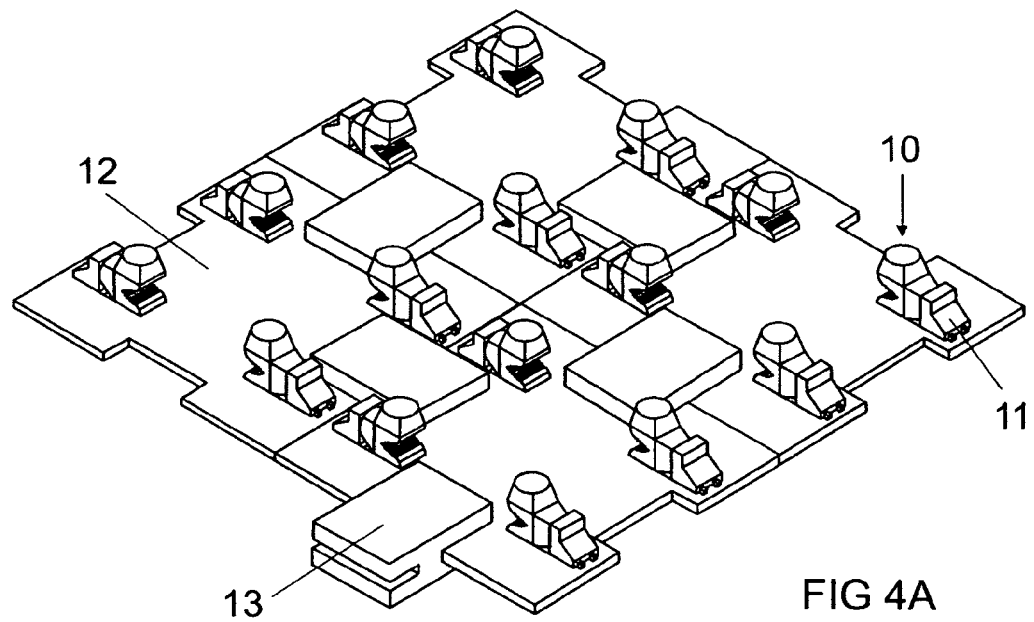
FIG. 4A shows a schematic perspective diagram of the illumination device in accordance with a third exemplary embodiment.
Figure 4B:
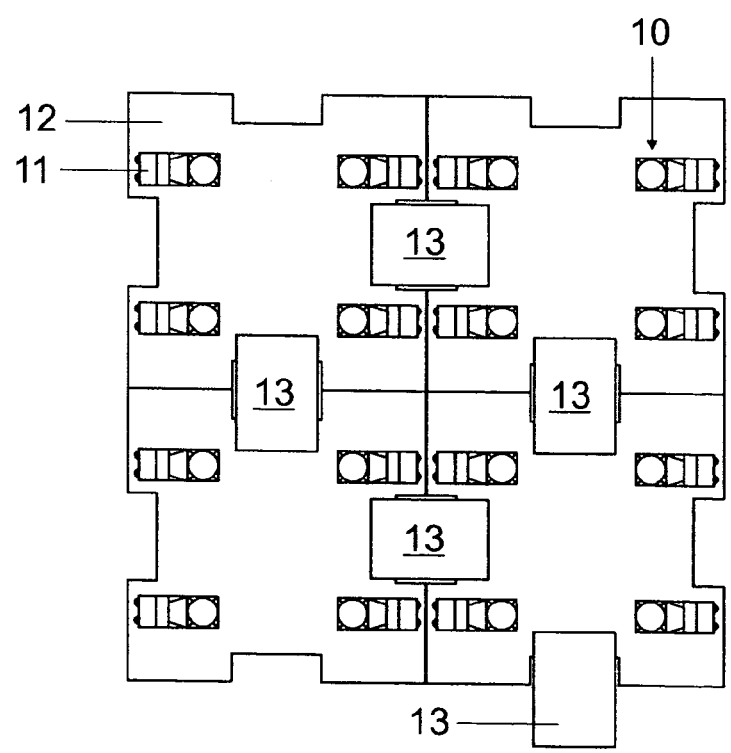
FIG. 4B shows a schematic plan view of the illumination device in accordance with the third exemplary embodiment.
Figure 4C:
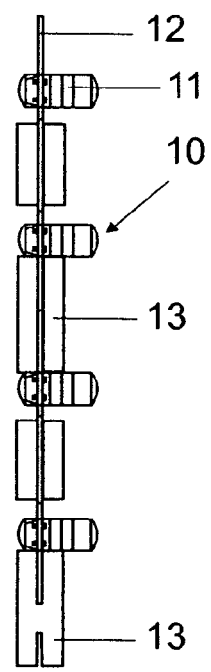
FIG. 4C shows a schematic side view of the illumination device in accordance with the third exemplary embodiment.
Figure 4D:
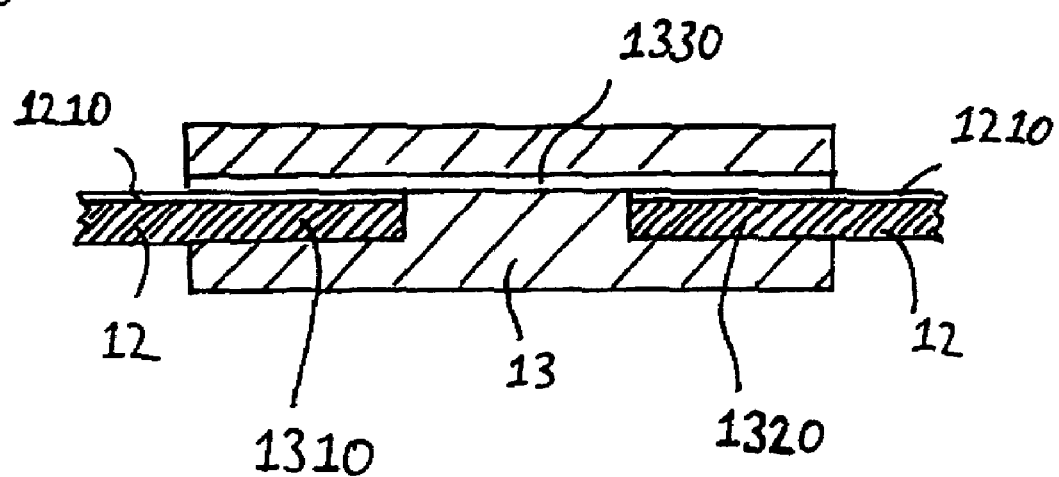
FIG. 4D shows a cross section of an electromechanical connector for connecting a plurality of illumination devices.

A third exemplary embodiment of the illumination device described here is explained in conjunction with FIGS. 4A to 4C. FIG. 4A shows a schematic perspective diagram of the illumination device in accordance with the third exemplary embodiment, FIG. 4B shows an associated plan view, and FIG. 4C shows the associated schematic side view. In the exemplary embodiment of FIGS. 4A to 4C, four illumination devices such as have been described in conjunction with FIGS. 3A to 3D are combined by means of electromechanical connections 13 to form a large-area illumination device. In this case, the electromechanical connections 13 produce an interconnection between the individual circuit boards 12. The electromechanical connections 13 mechanically and electrically connect the circuit boards 12 to one another. In this case, the mechanical connection of the circuit boards is preferably effected by pressing a circuit board 12 into the slot provided for the circuit board in the electromechanical connection 13. In one embodiment, as shown in FIG. 4D, the electromechanical connector 13 has two slots 1310, 1320 in each of which a circuit board 12 is pressed. A conducting part 1330, for example a metal strip or a metallic spring, extends from the first slot 1310 to the second slot 1320 and electrically connects a conductor track 1210 of the first circuit board to a conductor track 1210 of the second circuit board. Preferably, the electromechanical connector comprises a plurality of conducting parts 1330, each preferably electrically connecting one conductor track of the first circuit board to a conductor track of the second circuit board.

As an alternative to the electromechanical connections 13, the connection of the circuit boards 12 by means of a stranded lead is also possible. A stranded lead, or stranded wire, is usually composed of a bundle of small-gauge wires wrapped in a particular pattern, preferably inside an insulating cover, to make a larger conductor. This is known to any person ordinarily skilled in the art.

The circuit boards 12 may be arranged one-dimensionally. Such a one dimensional arrangement can include embodiments wherein the individual circuit boards are just arranged in row and other embodiments wherein the circuit boards are arranged in a row and at least some of them are electrically connected in series. It is also possible for the circuit boards 12 to be arranged and connected up to one another two-dimensionally. Such a two dimensional connection of four circuit boards 12 is shown in FIGS. 4A and 4B. In this case, it is also possible, in particular, for individual modules of the illumination device, that is to say individual circuit boards 12 with associated light emitting diodes 11 and optical elements 10, to be individually drivable. A coarsely pixelated display that emits in two different directions may thereby be made possible. If RGB light emitting diodes are used in this case, this results in a coarsely pixelated multicolor display. If the light emitting diodes 11 of each circuit board 12 are individually drivable, the resolution of such a display can advantageously be increased.

The illumination device described here may be used for example in the areas of outdoor advertising, information systems, luminaire construction—that is to say general lighting, interior design—here for example luminous RGB room dividers and for video walls.

The invention is not restricted by the description on the basis of the exemplary embodiments. Rather, the invention encompasses any new feature and also any combination of features, which in particular comprises any combination of features in the patent claims, even if these features or this combination is itself not explicitly specified in the patent claims or exemplary embodiments.

I claim:

1. An illumination device, comprising:
a light emitting diode fixed on a circuit board; and
an optical element disposed downstream of the light emitting diode in a main emission direction, the optical element being configured for guiding a first portion of the electromagnetic radiation emitted by the light emitting diode during operation through the circuit board.

2. The illumination device as claimed in claim 1, in which the optical element is configured for guiding a second portion of the electromagnetic radiation emitted by the light emitting diode during operation, on the side of the circuit board on which the light emitting diode is fixed, in a direction away from the circuit board.

3. The illumination device as claimed in claim 1, in which the optical element has two radiation exit regions, which are optically decoupled from one another.

4. The illumination device as claimed in claim 3, in which the two radiation exit regions are arranged axially symmetrically with respect to a central axis running through a radiation entrance region of the optical element.

5. The illumination device as claimed in claim 1, in which the optical element has a radiation splitting region formed by a portion of the surface of the optical element.

6. The illumination device as claimed in claim 5, in which the radiation splitting region is suitable for splitting the electromagnetic radiation coupled into the optical element into two partial beams having identical intensity.

7. The illumination device as claimed in claim 1, in which the optical element has two radiation exit surfaces each adjoining air.

8. The illumination device as claimed in claim 1, in which the optical element has one radiation entrance surface adjoining air.

9. The illumination device as claimed in claim 1, in which the optical element is fixed on the circuit board.

10. The illumination device as claimed in claim 1, in which the circuit board has a perforation through which the optical element directs a portion of the electromagnetic radiation emitted by the light emitting diode during operation.

11. The illumination device as claimed in claim 10, in which the optical element has an undercut by means of which the optical element is clipped into the circuit board in the perforation.

12. The illumination device as claimed in claim 10, in which the optical element is fixed by means of a press-fit in the perforation.

13. The illumination device as claimed in claim 1, in which the circuit board is one of the following circuit boards: flexible circuit board, printed circuit board, metal-core circuit board.

* * * * *